United States Patent

Bischer, Jr. et al.

Patent Number: 5,828,493
Date of Patent: Oct. 27, 1998

[54] REFLECTORS

[75] Inventors: Carmen B. Bischer, Jr., Hayward; Edward A. Small, Jr., Santa Rosa, both of Calif.

[73] Assignee: Dielectric Coating Industries, Hayward, Calif.

[21] Appl. No.: 710,464

[22] Filed: Sep. 17, 1996

Related U.S. Application Data

[60] Continuation-in-part of Ser. No. 344,159, Nov. 23, 1994, abandoned, which is a division of Ser. No. 58,642, May 5, 1993, Pat. No. 5,395,662, which is a continuation-in-part of Ser. No. 919,768, Jul. 24, 1992, Pat. No. 5,312,647.

[51] Int. Cl.$^6$ ........................................... G02B 1/10
[52] U.S. Cl. ..................... 359/584; 359/585; 428/450; 428/912.2
[58] Field of Search ..................... 359/585, 584, 359/884, 295, 572, 576; 428/472.1, 472.2, 912.2, 450

[56] References Cited

U.S. PATENT DOCUMENTS

| | | | |
|---|---|---|---|
| 2,108,604 | 2/1938 | Mason | 359/884 |
| 2,519,722 | 8/1950 | Turner | 359/584 |
| 2,812,270 | 11/1957 | Alexander | 427/251 |
| 2,952,569 | 9/1960 | Baer et al. | 427/251 |
| 3,951,526 | 4/1976 | Grossman | 359/851 |
| 4,371,587 | 2/1983 | Peters | 427/255.3 |
| 4,379,196 | 4/1983 | Halper | 427/162 |
| 4,475,794 | 10/1984 | Baker et al. | 427/534 |
| 4,482,209 | 11/1984 | Grewal et al. | 427/162 |
| 4,735,488 | 4/1988 | Rancourt et al. | 359/586 |
| 4,737,252 | 4/1988 | Hoffman | 204/192.16 |
| 4,868,004 | 9/1989 | Zültzke et al. | 427/567 |
| 4,944,581 | 7/1990 | Ichikawa | 359/883 |
| 4,961,994 | 10/1990 | Cariou et al. | 428/408 |
| 5,007,710 | 4/1991 | Nakajima et al. | 359/589 |
| 5,062,900 | 11/1991 | Berneron et al. | 427/535 |
| 5,063,096 | 11/1991 | Kohara et al. | 428/411.1 |
| 5,068,568 | 11/1991 | De Vrieze et al. | 313/474 |
| 5,084,351 | 1/1992 | Philips et al. | 428/411.1 |
| 5,110,637 | 5/1992 | Ando et al. | 427/419.2 |
| 5,216,551 | 6/1993 | Fujii | 427/419.7 |
| 5,372,874 | 12/1994 | Dickey et al. | 428/216 |
| 5,437,931 | 8/1995 | Tsai et al. | 428/446 |
| 5,583,704 | 12/1996 | Fujii | 359/585 |
| 5,760,981 | 6/1998 | Gillich | 359/883 |

FOREIGN PATENT DOCUMENTS 61-233701  10/1986  Japan ..................... 359/584

*Primary Examiner*—Jon W. Henry
*Assistant Examiner*—John Juba, Jr.
*Attorney, Agent, or Firm*—H. Michael Brucker

[57] ABSTRACT

A reflector formed on a base with a thick (0.5 to 2.0 microns) layer of non-porous oxide underlying an aluminum vacuum deposited layer which supports a pair of quarter wavelength reflectance-enhancing layers.

30 Claims, 2 Drawing Sheets

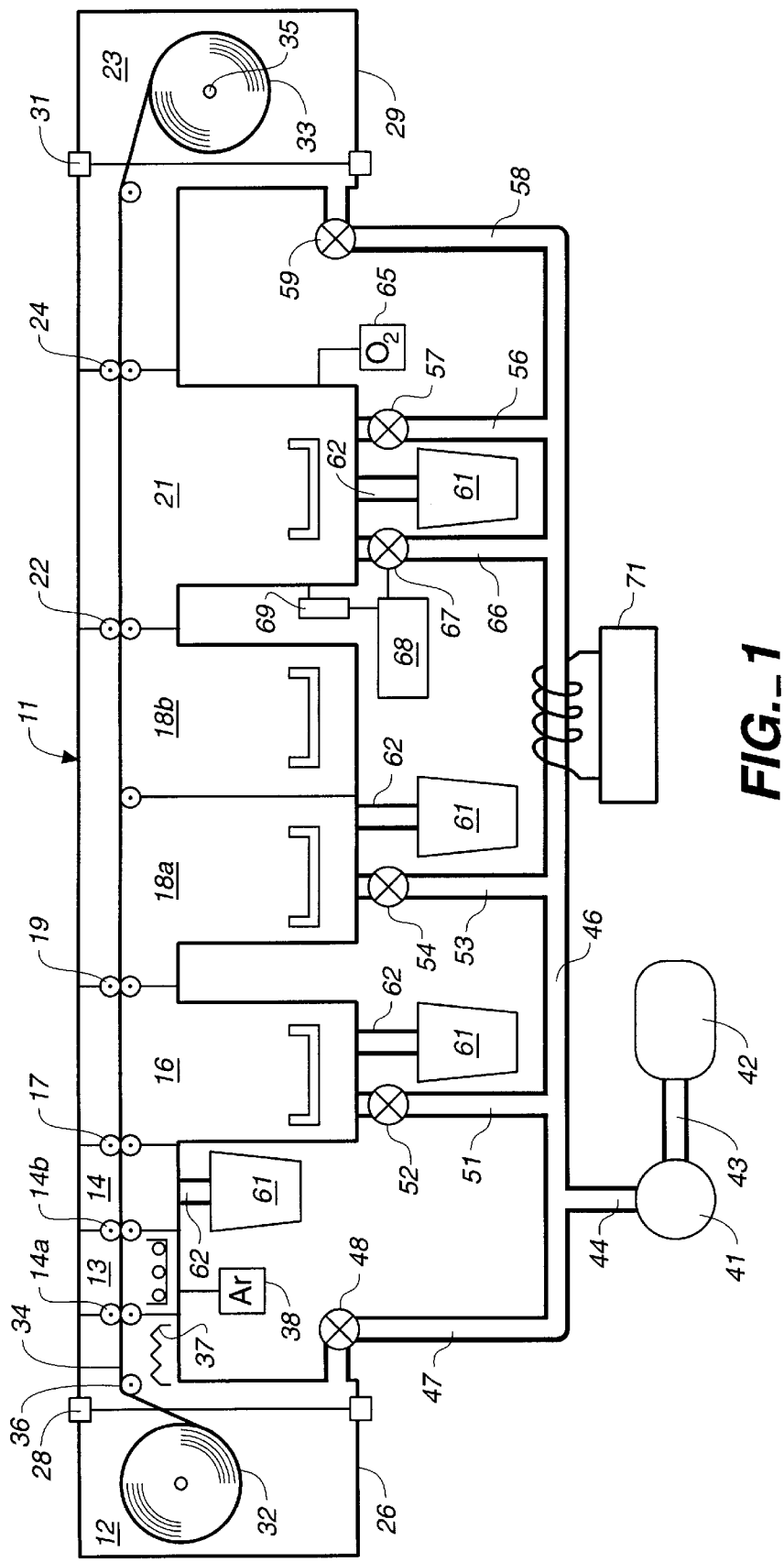
FIG._1

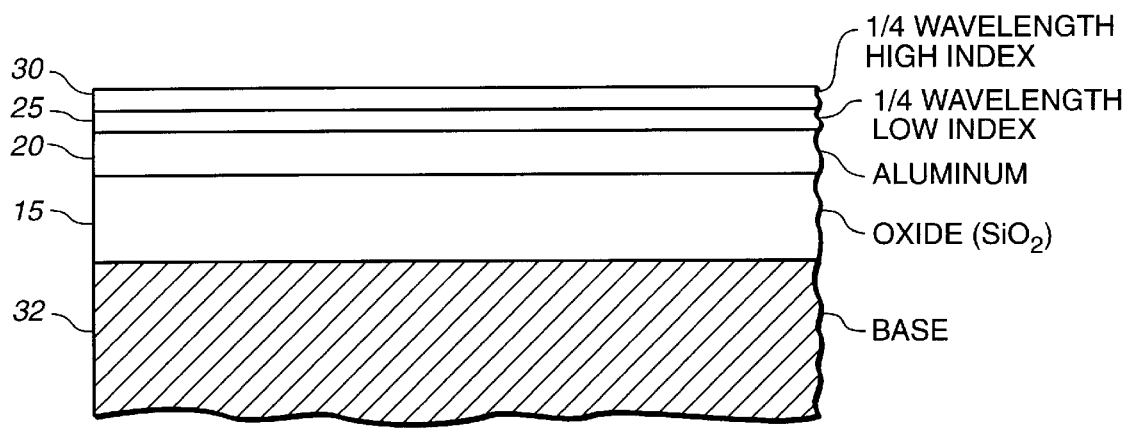
FIG._2

REFLECTORS

This is a continuation-in-part of our patent application Ser. No. 08/344,159, filed Nov. 23, 1994, for "Improvements In Reflective Aluminum Sheeting" now abandoned, which is a divisional continuation of application Ser. No. 08/058,642, filed May 5, 1993 and now U.S. Pat. No. 5,395,662, which is a continuation-in-part of application Ser. No. 07/919,768, filed Jul. 24, 1992 and now U.S. Pat. No. 5,312,647.

BACKGROUND OF THE INVENTION

The present invention relates to improvements in reflectors and in particular to high reflectance (above 92%) reflectors formed onto a substrate by the vacuum deposition of various materials to form a laminate that has a reflectivity that is greater than the reflectivity of the substrate alone. The invention is particularly suited, and will be described with reference to, the deposition of a high reflective surface onto an aluminum web.

The present invention relates to high reflectance reflectors, and as such, presents the challenge of producing a reflector that can reflect 92% or more of incident light while being durable enough to function in commercial settings. To prevent scratching and dulling from cleaning or handling, many reflector designs dispose clear protective overcoats to the reflecting surface. Such designs, however, sacrifice reflectivity for durability, as any such protective overcoat will be a source of light absorption and/or interfere with the optical design, all with the result of reducing the overall reflectivity. The present invention relates to those reflectors that strive for reflectivities that are incompatible with the use of protective overcoats. By the present invention, both durability and high reflectivity are achieved without the use of protective overcoats.

The invention will be described primarily with regard to aluminum substrates (webs), since they enjoy many commercial advantages over other materials. The invention is not so limited, however, as the unexpected result of durability results from a thick vacuum deposited oxide layer on a smooth substrate and disposed under a vacuum deposited aluminum reflectance layer. The base material, which must be smooth, can be any material, such as steel, that can be made very smooth and subjected to the vacuum deposition process. Other materials are capable of meeting that criteria as well.

The basic method for the vacuum deposition of a high reflective surface onto an aluminum web has been practiced for many years and is thus well known in the art. This well known method has been practiced on webbing in the form of individual sheets of glass or aluminum, typically 40 inches wide, 0.020 inches thick and 50 inches long, weighing approximately four pounds. In the present invention, a coil of aluminum, typically 40 inches wide, 0.020 inches thick and from 1000 to 1500 feet long, weighing 900 to 1400 pounds or more is unwound from an unwinding coil onto a winding coil and the high reflective coatings are vacuum deposited onto the traveling web in stages as the web travels between the unwinding coil to the winding coil.

This method is effective to transform a web, such as polished anodized aluminum (called lighting sheet) having a reflectivity of about 85% into lighting sheet having a reflectivity of about 95% or more. This increase in reflectivity is significant when, for example, the sheet is used for reflectors for increasing the light output from lighting fixtures.

One basic, known method of transforming lighting sheet into reflectors includes the following steps. A sheet of anodized aluminum is inserted into a vacuum chamber which is subdivided into a series of internal vacuum compartments which are separated by seals that permit each compartment to be at the particular pressure suitable for the process being performed within that compartment. The anodized aluminum sheet is transported from one compartment to another to permit whatever process is being performed in that compartment to be applied to the sheet. To fully appreciate the present invention, it is necessary to understand the structure of the surface coating on anodized aluminum.

*The Surface Treatment and Finishing of Aluminum and Its Alloys.* (Fifth Edition, 1987, pp 324–368) describes the basic reaction in all anodizing processes as the conversion of the aluminum surface to aluminum oxide while the part is made the anode in an electrolytic cell. The anodic process creates a film having a porous coating having a hexagonal cell structure (pp 324). Since the reasons for anodizing are inter alia, to permit subsequent plating, to permit application of photographic and lithographic emulsion, etc., the inherent porosity of the anodic film enhances the electroplating and offers a mechanical means of holding an emulsion.

For lighting sheet, however, the porous surface of the anodized aluminum web is not desired and requires that the material be heated to drive off the water (to prevent corrosion by the trapped water attacking the underlying aluminum substrate) and sealed (to prevent the collection of additional dust and water at the surface). Because the vacuum deposition of an aluminum layer directly onto anodized aluminum has been observed to result in corrosion, we have developed the practice of vacuum depositing a thin layer of oxide (such as $SiO_2$) over the anodized surface to prevent this corrosion from occurring.

Thus, in the first compartment, the aluminum sheet is exposed to heat to drive out water.

In the next compartment, the sheet is exposed to a glow discharge, typically maintained by argon gas, to drive out any remaining water and for further heating to facilitate adhesion.

Next the sheet is placed into a compartment where a thin oxide layer (typically 0.001 microns) is applied to increase adhesion and prevent the anodized (aluminum dioxide) layer which covers the polished aluminum sheet stock from causing corrosion.

In the next compartment, an opaque layer of pure aluminum is deposited onto the web. This layer, not the substrate base, becomes the bottom reflector for incident light. The thickness of this layer is nominally 600 Å, although the thickness is not critical. At the lower end of the thickness range, the layer must be thick enough to be opaque and at the upper end, not so thick as to lose its optical qualities.

In the following compartments, the classical reflectance-enhancing layers of a quarter wave length of low refractive index material, then a quarter wave length of a high refractive index material are deposited onto the vacuum deposited aluminum layer. It will be understood by those skilled in the art that "low" and "high" as used in connection with the refractive index of reflectance-enhancing layers are relative terms. The low index materials are lower than the high index materials. The absolute values are less important, although well known in the art. Similarly, the "quarter wave length" thicknesses will be understood to be of a quarter wave length of nominally 550 nanometers (center of visible spectrum). See U.S. Pat. No. 5,007,710 to Nakajima et al.

The high index of refraction material is of the kind deposited in an atmosphere of a partial pressure of oxygen and a partial pressure of water vapor. Each coating is applied in a vacuum compartment to which the sheet is transported after the preceding coating has been applied.

The present invention teaches the use of un-anodized aluminum web material in place of anodized aluminum to improve the reflector's durability while reducing the cost. So long as the un-anodized aluminum has a high reflectance finish, it can be roll polished, mill finished, embossed or any other process or treatment that gives the required surface reflectance, as best suits the desired end result. Thus, it is to be understood that wherever the term "polished" is used in the following description and claims, it is to include any of the several methods known to those of ordinary skill in the art for producing a high reflectance finish, including without limitation, roll polishing.

An important aspect of the invention is found in the aluminum base material used as the substrate. Unlike the prior art that teaches an aluminum base that has been anodized (lighting sheet) to protect the otherwise fragile surface of bare polished aluminum, the present invention utilizes a base material of un-anodized aluminum to which has been applied a layer of oxide (such as $SiO_2$). This oxide layer is thick relative to oxide layers applied over anodized aluminum, but is thinner than the typical anodized layer (1.7 microns) regularly found on lighting sheet. Thus, where we have used a thin oxide layer (less than 0.001 microns) over a thick anodized oxide layer to prevent corrosion which the anodized layer tends to promote, the present invention uses a single oxide layer, orders of magnitude thicker than the corrosion resistant layer, but thinner than the anodized layer.

By applying the relatively thick oxide layer onto the un-anodized aluminum substrate by vacuum deposition, the structure gains the advantage of a virtually non-porous surface. As reported in *Thin Solid Films, International Journal on the Science and Technology of Thin and Thick Films,* Vol. 156 No. 1, Jan. 15, 1988:

> Thin layers of $SiO_2$ formed by vacuum deposition are non-porous and electron micrographs show they have smooth, glass-like surfaces. These non-porous films prevent any water and dust particles from penetrating underlying materials.

For aluminum based reflectors, the substitution of a single vacuum deposited layer of an oxide such as $SiO_2$ for an anodized layer and a corrosion resistant layer of oxide results in a reflector both less expensive to produce and unexpectedly more durable. This unexpected durability is a product of not following our prior technique of depositing a thin oxide layer (over the anodized layer), but rather applying a relatively thick vacuum deposited layer (greater than 0.5 microns). Because an anodized oxide layer is cellular in structure (spongy) above 0.35 microns thick, the elimination of the anodized layer altogether and the substitution in its place with a solid, glass-like material results in a far superior structure.

It is an object of the invention to provide a high reflectance reflector having a laminated structure bonded to a substrate wherein the structure includes a layer of oxide greater than 0.5 microns thick as a base for a layer of pure aluminum to which a quarter wavelength thick layer of a low index of refraction material and a quarter wavelength thick layer of a high index of refraction material are applied.

Another object of the invention is to provide such a structure to a substrate of un-anodized, roll-polished aluminum.

Other objects of the present invention will in part be obvious and will in part appear hereafter.

BRIEF DESCRIPTION OF THE DRAWINGS

FIG. 1 is a schematic diagram of vacuum deposition equipment useful in connection with the improvements of the present invention; and FIG. 2 is a partial cross-sectional view of a layered reflector structure in accordance with the present invention.

DESCRIPTION OF PREFERRED EMBODIMENT

Referring to FIG. 1, a vacuum chamber 11 is subdivided into a number of low pressure vacuum compartments where the vacuum deposition process takes place. An unwinding compartment 12 is separated from a glow discharge compartment 13 by a rolling seal 14a. Glow discharge compartment 13 is separated from a pressure differential compartment 14 by a rolling seal 14b, while the pressure differential compartment is separated from an adhesion deposition compartment 16 by rolling seal 17. A compartment 18 is subdivided into sections 18a and 18b for the application of an aluminum layer and a low index layer and is separated from the adhesion compartment by rolling seals 19, while compartment 18b is separated from a high index deposition compartment 21 by rolling seals 22. Finally, a winding compartment 23 is separated from the high index compartment by rolling seals 24.

The rolling seals 14a, 14b, 17, 19, 22, and 24, are all of a type well known in the art for maintaining pressure separation between adjacent vacuum compartments even while allowing material to pass between them. Thus, the construction of the seals does not form any part of the invention per se. It is, however, a characteristic of these seals that in being required to continuously pass a moving web, they necessarily permit some leakage. The operation of vacuum pumps, as more fully described below, keeps each compartment at its required pressure even though there is some migration across the seals.

Compartment 12 is formed at one end 26 of the vacuum chamber 11 and can be opened at pressure seal 28. Compartment 23 is formed at the other end 29 of vacuum chamber 11 and can be opened at pressure seal 31. In this way, compartment 12 can be opened to receive and hold a coil of aluminum 32 in vacuum chamber 11 for deposition of a coating of high reflective material. And compartment 23 can be opened to permit a coil 33 of finished material to be removed from the chamber 11.

Referring to FIG. 2, as well, the apparatus performs the deposition process as follows. A coil 32 of aluminum (un-anodized polished aluminum as described below) is loaded into compartment 12 and the web 34 fed through the various rolling seals to take-up coil 33. The take-up coil is mounted on a spindle 35 that is driven clockwise by an appropriate power train (not shown) to coil the processed web and provide a drive for unwinding the web from coil 32 and transporting it through the various process compartments.

The chamber 11 is sealed closed and pumped to a low pressure by well known means such as a rotary pump 41 and a mechanical pump 42 which are connected in series through pressure line 43. The pumps 41 and 42 are connected through a feed line 44 to a main pump line 46 which connects to the individual compartments within chamber 11, except for the glow discharge compartment 13 and pressure differential compartment 14. Pump line 46 connects to the unwinding compartment 12 through line 47 and valve 48; to the adhesion compartment 16 through line 51 and valve 52; to the aluminum and low index compartments 18a and 18b through line 53 and valve 54; to the high index compartment 21 through line 56 and valve 57; and, to the winding compartment 23 through line 58 and valve 59.

After the pumps 41 and 42 lower the pressure in the compartments within their range of capability, the valves 48, 52, 54, 57 and 59 are closed and compartments 14, 16, 18a, 18b and 21 are pumped to yet a lower pressure by cryogenic pumps 61 operatively associated with each of those compartments through lines 62.

The various pressures required to be maintained in each compartment is well known in the art and readily achievable with well known apparatus. By way of example only, the working pressure in the unwinding compartment 12 and the winding compartment 23 may be 40 microns, while that in the glow discharge compartment 13 is 20 to 30 microns. The pressure in the glow discharge compartment is established without pumping that compartment directly. Rather, the pressure in compartment 13 is set by establishing a pressure in compartment 14 that is higher than the pressure in compartment 16 (but lower than the pressure in compartment 12) in an amount that sets up a pressure gradient across seals 14a and 14b that establishes the requisite pressure in compartment 13. Because compartment 16 is maintained at a very low pressure, differential pressure chamber 14 is formed by two seals 14b and 17 and pumped by its associated pump 61 to a pressure that establishes the correct gradient between seals 14a and 14b to set the pressure in compartment 13 at the required level.

The adhesion compartment 16 is pumped to $10^{-4}$ torr,, the aluminum compartment 16 and low index compartment 18a are pumped to $2 \times 10^{-5}$ torr,, and the high index compartment 21 is pumped to $6 \times 10^{-5}$ torr.

As the aluminum web 34 is transported from coil 32 in unwinding compartment 12 to coil 33 in winding compartment 33, it passes through, and is guided by, the various rolling seals that separate the various internal compartments within chamber 11. In these compartments, the moving web is subjected to the process taking place in that compartment, eventually leading to a web with a high reflective coating.

As the web leaves the coil 32, it is fed over a guide roller 36 and into rolling seals 14a and 14b. Within compartment 12 and between the coil 32 and the seal 14a, the web 34 is heated by a heater 37 to drive out water carried on the aluminum surface, creating water vapor within compartment 12. Because the pressure in unwinding compartment 12 is higher than the pressure in glow chamber 13, the water vapor migrates across the seal 14a into compartment 13 where it is used to maintain the glow discharge initiated by the use of argon gas from a gas supply source 38. The use of water vapor alone to maintain a glow discharge initiated by argon is taught for the first time by the present invention. When the argon gas is discontinued altogether, the combination of the water vapor from chamber 12 (or an alternate independent source) and the additional water vapor created by the glow discharge bombardment of the web will maintain the glow by itself at a much reduced cost.

The water vapor in compartment 12 can also be used in high index compartment 21 to stabilize the required pressure and background atmosphere therein to properly carry out the deposition of high index material over a significant period of time.

The high index deposition process starts out in an atmosphere of oxygen and water vapor. As the process progresses, oxygen is consumed and resupplied at a constant rate from oxygen supply 65. The initial water vapor is also consumed in the process with an attendant drop in pressure in compartment 21. In prior art methods and apparatus where the duration of the process is relatively short, this loss of water vapor is compensated for by increasing the flow of oxygen into the compartment. For long duration processes, however, as contemplated by the present invention, oxygen alone cannot adequately stabilize the process.

Thus, in the present invention, water vapor is made available to compartment 21 to augment the water vapor taken from the walls of the compartment in the deposition process. A convenient source of that water vapor is compartment 12, although an independent source could be used. A feed line 66 off of main pump line 46 connects through a valve 67 to compartment 21. By opening valve 48 at compartment 12, water vapor from that compartment is available to compartment 21 whenever valve 67 is open. A valve control means 68 receives a signal from pressure sensor 69 which senses the pressure in compartment 21. The control means (which can be any one of several well known devices for controlling valve operation) is adjusted to have a set point pressure at which it opens valve 67 and a set point at which it closes the valve. When the pressure in compartment 21 varies from the set point pressure by a pre-set amount, that condition is sensed by sensor 69 and control means 68 causes valve 67 to open to permit water vapor into the chamber to re-establish the required pressure and resupply water vapor leached from the walls of the compartment in the deposition process. When the desired conditions have been re-established, sensor 69 sends a signal to control means 68 and the valve 67 closes, cutting off the flow of water vapor.

A heater 71 is operatively associated with the main pressure line 46 to keep the water vapor in line 46 from condensing as it travels from compartment 12 to compartment 21.

The interjection of water vapor into glow discharge chamber 13 is facilitated in the preferred embodiment across the rolling seal 14a by the force of an established pressure gradient. The same result can be achieved by the use of an arrangement of parts substantially identical to that described with reference to the interjection of water vapor into compartment 21. In that case, a separate line from compartment 12 to compartment 13 through appropriate valving would permit the metering of water vapor to compartment 13 as needed to sustain the glow discharge therein.

After leaving the glow discharge compartment 13, the web 34 enters the adhesion compartment 14 where a layer of oxide 15 is deposited onto the roll-polished aluminum base 32 to a thickness greater than 0.5 microns. Because the aluminum so deposited becomes more susceptible to cracking at thicknesses much above 2.0 microns, the preferred range is between 0.5 and 2.0 microns, with the preferred thickness being about 1.5 microns.

In aluminum compartment 18a, a layer of pure aluminum 20 is vacuum deposited onto the oxide layer to a preferred thickness of 600 Å. The thickness of the aluminum layer 20 is not critical so long as it is opaque. This layer is the base reflection layer off of which light reflects.

In compartment 18b, a quarter wavelength (nominally 550 Å) thick layer 25 of low refractive index material is deposited over the aluminum layer 20. Layer 25, together with a quarter wavelength (nominally 550 Å) thick layer 30 of high refractive index material deposited in compartment 21 over the layer 20, create a reflectance enhancing coating that increases the reflectance over that of aluminum layer 20 alone If a high reflectance finish is vacuum deposited onto a polished aluminum base which has not otherwise been treated, the resulting material will scratch or sleek so severely when cleaned as to significantly reduce its reflectance. It has long been known that a cleanable surface can be created by anodizing the polished aluminum prior to the vacuum deposition process.

Because the chemical process of anodizing aluminum is both costly and creates a surface that must be treated and sealed before it can be used or additional layers can be added, it is of considerable advantage in producing high reflectance aluminum if a substrate of polished aluminum can be used rather than anodized aluminum. In the present invention, the polished aluminum substrate is not anodized and the surprising result is a product with equal or superior scratch resistance and superior weathering characteristics.

A step that we have used in the process of producing a high reflectance material using anodized aluminum as a base material is the vacuum deposition of a thin layer of oxide (usually silica) onto the base prior to deposition of the high reflectance materials.

Whereas the typical layer of oxide we applied to an anodized aluminum substrate prior to applying high reflectance layers is 0.001 microns, in the present invention, a layer 15 0.5 to 2.0 microns thick of oxide (500 to 2,000 times thicker), such as silica ($SiO_2$), is applied to the un-anodized roll-polished aluminum substrate 32. The advantages of the invention are realized with a layer 15 0.5 microns thick. Maximum results have been experienced at approximately 1.5 microns. A thickness of 2.0 microns is satisfactory and enjoys the benefits of the invention; over 2.0 microns, the structure is more subject to cracking. After the aluminum layer 20 and the quarter wavelength layers 25 and 30 are deposited onto the web, the resulting high reflectance material has all of the benefits of one having an anodized substrate, but with superior weathering and scratch resistance. All at a reduced cost. Thus, by vacuum depositing a heretofore unheard of thickness of oxide onto an un-anodized aluminum base, the need for anodized aluminum as a substrate is eliminated, along with the cost of anodization and the disadvantages of the anodized material's spongy structure.

The resulting high reflectance material compares to the more expensive anodized-base materials in the following ways: equivalent or better abrasion resistance; superior weatherability (resistance to humidity); superior workability (can be formed with fewer microcracks); compatible with high reflectance vacuum deposition process; and significantly lower cost.

The invention having been fully described, it is not to be limited to the details herein set forth, but is of the full scope of the appended claims.

We claim:

1. A high reflectance reflector comprising:
   a base of unanodized aluminum;
   a non-porous layer of oxide at least 0.5 microns thick deposited over said base;
   an opaque layer of aluminum vacuum deposited onto said layer of oxide;
   a quarter wavelength thick layer of a low index of refraction material and a quarter wavelength thick layer of a high index of refraction material vacuum deposited onto said layer of aluminum.
2. The reflector of claim 1 wherein said base is polished aluminum.
3. The reflector of claim 2 wherein:
   said non-porous layer of oxide is 0.50 to 2.0 microns thick.
4. The reflector of claim 2 wherein said non-porous oxide is $SiO_2$.
5. The reflector of claim 2 wherein:
   said non-porous layer of oxide is 0.50 to 2.0 microns thick.
6. The reflector of claim 1 wherein:
   said non-porous layer of oxide is 0.50 to 2.0 microns thick.
7. The reflector of claim 6 wherein said non-porous oxide is $SiO_2$.
8. The reflector of claim 1 wherein said non-porous oxide is $SiO_2$.
9. The reflector of claim 1 wherein said non-porous oxide is $SiO_2$.
10. A reflector formed according to the following process:
    vacuum depositing onto a smooth base a non-porous layer of oxide to a thickness of at least 0.5 microns;
    vacuum depositing over said non-porous layer of oxide an opaque layer of aluminum; and
    vacuum depositing over said layer of aluminum, quarter wavelength reflectance-enhancing layers.
11. The reflector of claim 8 wherein said base is polished aluminum.
12. The reflector of claim 11 wherein:
    said non-porous layer of oxide is 0.50 to 2.0 microns thick.
13. The reflector of claim 11 wherein said non-porous is $SiO_2$.
14. The reflector of claim 10 wherein:
    said non-porous layer of oxide is 0.50 to 2.0 microns thick.
15. The reflector of claim 14 wherein said non-porous oxide is $SiO_2$.
16. The reflector of claim 10 wherein said non-porous oxide is $SiO_2$.
17. The reflector of claim 10 wherein said base is un-anodized aluminum and the steps further comprising:
    subjecting said base to a glow discharge.
18. The reflector of claim 17, the steps further comprising:
    supplying water vapor to the glow discharge.
19. The reflector of claim 17, the steps further comprising;
    subjecting the base of un-anodized aluminum to heat under vacuum to drive off water vapor.
20. The reflector of claim 19 wherein said water vapor is supplied to said glow discharge.
21. A high reflectance reflector comprising:
    a base of polished metal;
    a non-porous layer of oxide at least 0.5 microns thick deposited over said base;
    an opaque layer of aluminum vacuum deposited onto said layer of oxide;
    a quarter wavelength thick layer of a low index of refraction material and a quarter wavelength thick layer of a high index of refraction material vacuum deposited onto said layer of aluminum.
22. The reflector of claim 21 wherein said base is unanodized aluminum.
23. The reflector of claim 22 wherein:
    said non-porous layer of oxide is 0.50 to 2.0 microns thick.
24. The reflector of claim 21 wherein said base is polished aluminum.
25. The reflector of claim 24 wherein:
    said non-porous layer of oxide is 0.50 to 2.0 microns thick.
26. The reflector of claim 21 wherein said base is unanodized polished aluminum.
27. The reflector of claim 26 wherein:
    said non-porous layer of oxide is 0.50 to 2.0 microns thick.
28. The reflector of claim 26 wherein said non-porous oxide is $SiO_2$.
29. The reflector of claim 21 wherein:
    said non-porous layer of oxide is 0.50 to 2.0 microns thick.
30. The reflector of claim 21 wherein said non-porous oxide is $SiO_2$.

* * * * *